(12) United States Patent
Morikado

(10) Patent No.: US 8,238,159 B2
(45) Date of Patent: Aug. 7, 2012

(54) NON-VOLATILE SEMICONDUCTOR STORAGE DEVICE AND METHOD OF CONTROLLING THE SAME

(75) Inventor: Mutsuo Morikado, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 144 days.

(21) Appl. No.: 12/887,167

(22) Filed: Sep. 21, 2010

(65) Prior Publication Data

US 2011/0075483 A1 Mar. 31, 2011

(30) Foreign Application Priority Data

Sep. 25, 2009 (JP) ................................ 2009-220139

(51) Int. Cl.
*G11C 16/04* (2006.01)
(52) U.S. Cl. .............................. 365/185.17; 365/185.18
(58) Field of Classification Search ............. 365/185.17, 365/185.18, 185.11, 185.23
See application file for complete search history.

(56) References Cited

U.S. PATENT DOCUMENTS

| 7,020,025 | B2 | 3/2006 | Sato et al. | |
|---|---|---|---|---|
| 7,092,294 | B2 | 8/2006 | Sato et al. | |
| 7,684,243 | B2 * | 3/2010 | Aritome et al. | 365/185.17 |
| 8,023,327 | B2 * | 9/2011 | Futatsuyama | 365/185.17 |
| 2009/0052239 | A1 | 2/2009 | Joe et al. | |
| 2009/0073763 | A1 | 3/2009 | Hosono | |
| 2010/0046303 | A1 * | 2/2010 | Mihnea et al. | 365/185.22 |
| 2010/0155812 | A1 | 6/2010 | Morikado et al. | |

FOREIGN PATENT DOCUMENTS

| JP | 2009-70501 | 4/2009 |
|---|---|---|
| JP | 2010-147414 | 7/2010 |

* cited by examiner

*Primary Examiner* — Anh Phung
(74) *Attorney, Agent, or Firm* — Oblon, Spivak, McClelland, Maier & Neustadt, L.L.P.

(57) ABSTRACT

According to one embodiment, a non-volatile semiconductor storage device includes a control circuit. When performing a read operation, the control circuit is configured to: apply a first voltage to a selected word line that is connected to a selected memory cell, the first voltage being a voltage between a plurality of threshold voltage distributions; apply a second voltage to a first unselected word line adjacent to the selected word line, the second voltage being not more than the first voltage; apply a third voltage to a second unselected word line adjacent to the first unselected word line, the third voltage being not less than a read pass voltage at which non-volatile memory cells become conductive; and apply the read pass voltage to a third unselected word line, the third unselected word line being an unselected word line other than the first unselected word line and the second unselected word line.

20 Claims, 9 Drawing Sheets

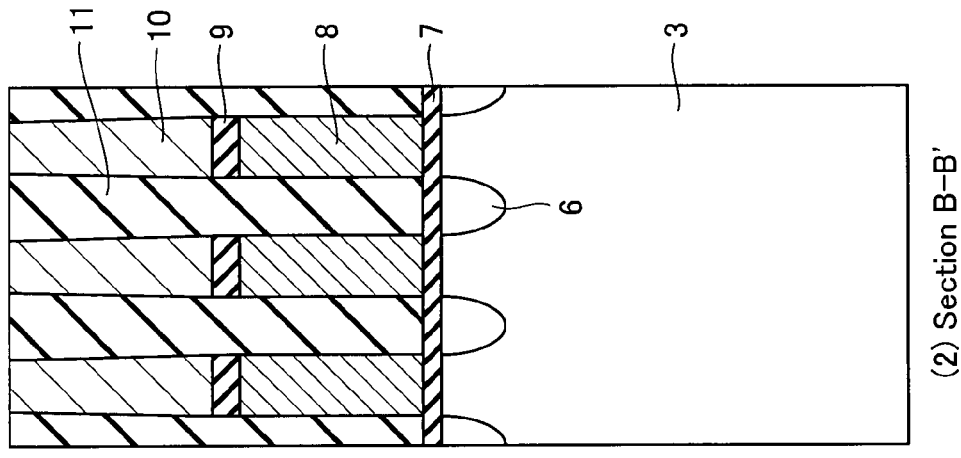
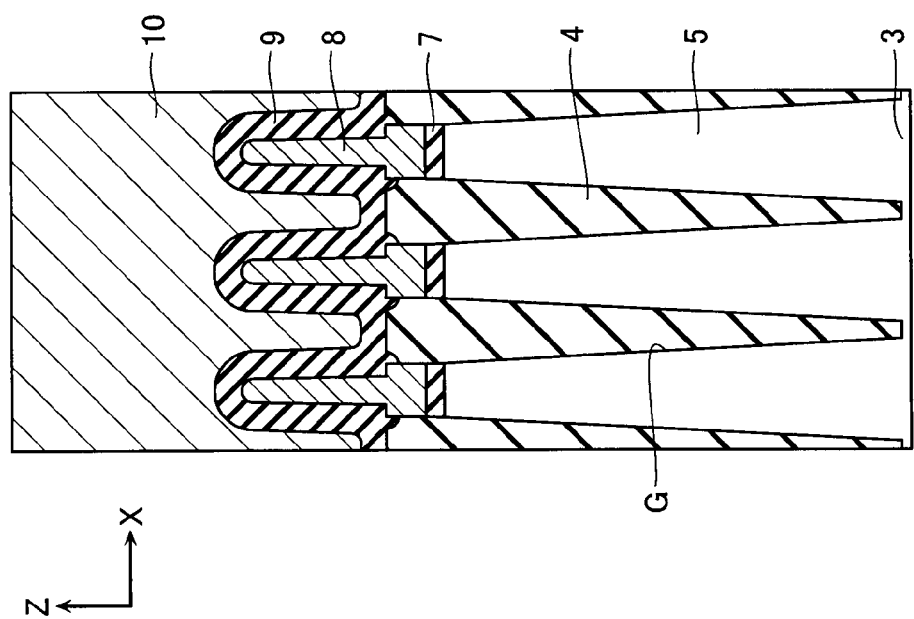

Binary Data Storage (Vcgrv=VX)

Quaternary Data Storage (Vcgrv=AR, BR, or CR)

Quaternary Data Storage (Vcgrv=AR, BR, or CR)

ex.1

| Vcgrv | VcgrvL | VcgrvH |
|---|---|---|
| AR=0V | −1 | 8 |
| BR=1V | 0 | 7 |
| CR=2V | 1 | 6 | ex.2

| Vcgrv | VcgrvL | VcgrvH |
|---|---|---|
| AR=0V | −1 | 8 |
| BR=1V | 0 | 8 |
| CR=2V | 1 | 8 | ex.3

| Vcgrv | VcgrvL | VcgrvH |
|---|---|---|
| AR=0V | −1 | 8 |
| BR=1V | −1 | 7 |
| CR=2V | −1 | 6 | ex.4

| Vcgrv | VcgrvL | VcgrvH |
|---|---|---|
| AR=0V | −1 | 8 |
| BR=1V | −1 | 8 |
| CR=2V | −1 | 8 |

Quaternary Data Storage (Vcgrv=BR.CR)

Quaternary Data Storage (Vcgrv=AR)

NON-VOLATILE SEMICONDUCTOR STORAGE DEVICE AND METHOD OF CONTROLLING THE SAME

CROSS REFERENCE TO RELATED APPLICATIONS

This application is based upon and claims the benefit of priority from prior Japanese Patent Application No. 2009-220139, filed on Sep. 25, 2009, the entire contents of which are incorporated herein by reference.

BACKGROUND

1. Field

Embodiments described herein relate to NAND-type flash memory with memory cells having a stacked gate structure.

2. Description of the Related Art

In current NAND-type flash memory, memory cells are individually provided with floating gate electrodes. Write and erase operations are performed by injecting and emitting electrons to and from these floating gate electrodes. Multiple threshold voltage states (data states) may be set by controlling the amount of electrons to be stored in the floating gate electrodes. Recently, such NAND-type flash memory has been developed and mass-produced that stores multiple bits in one memory cell, such as 2 bits (quaternary) or 3 bits (octal).

In this NAND-type flash memory, the threshold voltage of memory cell varies with the amount of electrons stored in the floating gate electrode. In a read operation, a certain voltage Vcgrv (which is intermediate between a plurality of threshold voltage distributions) is applied to a selected word line, while a read pass voltage Vread (which makes a memory cell conductive irrespective of data) is applied to unselected word lines. The read operation is performed by determining whether or not current flows through a NAND cell unit upon application of these voltages.

In order to allow sufficient current to flow through unselected memory cells, such a voltage is used as a read pass voltage Vread that is higher than the upper limit of the highest threshold voltage distribution by on the order of 2 V. As miniaturization trend continues, the potential of the floating gate electrode of a selected memory cell may rise beyond expectations due to the read pass voltage Vread applied to adjacent unselected word lines. This leads to a phenomenon in which the threshold voltage of a selected memory cell appears to decrease. As a result, a selected memory cell may erroneously become conductive, although the selected memory cell has a certain threshold voltage supposed to be non-conductive. This may cause incorrect data from a selected memory cell in read operation.

BRIEF DESCRIPTION OF THE DRAWINGS

FIGS. 3A and 3B illustrate cross-sectional views of the memory cell array in the non-volatile semiconductor storage device according to the first embodiment;

DETAILED DESCRIPTION

A non-volatile semiconductor storage device according to one embodiment comprises: a memory cell array; word lines; bit lines; a source line; and a control circuit. The memory cell array includes an array of NAND cell units, each of which includes a memory string having a plurality of non-volatile memory cells connected in series and select transistors each connected to an end of the memory string. The word lines are each connected to a control gate electrode of each of the non-volatile memory cells. The bit lines are each connected to a first end of each of the NAND cell units. The source line is connected to a second end of each of the NAND cell units. The control circuit is configured to control a data read operation by selecting one of the non-volatile memory cells as a selected memory cell. The non-volatile memory cells are provided with a plurality of threshold voltage distributions allocated corresponding to multiple pieces of data to be stored. When performing a data read operation, the control circuit is configured to: apply a first voltage to a selected word line as one of the word lines that is connected to the selected memory cell, the first voltage being a voltage between the plurality of threshold voltage distributions; apply a second voltage to a first unselected word line as one of the word lines adjacent to the selected word line, the second voltage being not more than the first voltage; apply a third voltage to a second unselected word line as one of the word lines adjacent to the first unselected word line, the third voltage being not less than a read pass voltage at which the non-volatile memory cells may become conductive irrespective of the plurality of threshold voltage distributions provided thereto; and apply the read pass voltage to a third unselected word line, the third unselected word line being an unselected word line other than the first unselected word line and the second unselected word line.

Embodiments of the present invention will now be described in detail below with reference to the accompanying drawings. Certain components illustrated in the figures are identical to those previously described and are assigned the same numerals of reference. Those parts will not be described here to avoid unnecessary repetition. In addition, in the following embodiments, the non-volatile semiconductor storage device will be described as NAND-type flash memory with memory cells having a stacked gate structure. However, it will be obvious that this configuration is merely an example and the invention is not limited thereto.

First Embodiment

[Configuration of Non-Volatile Semiconductor Storage Device in First Embodiment]

Figure 1:
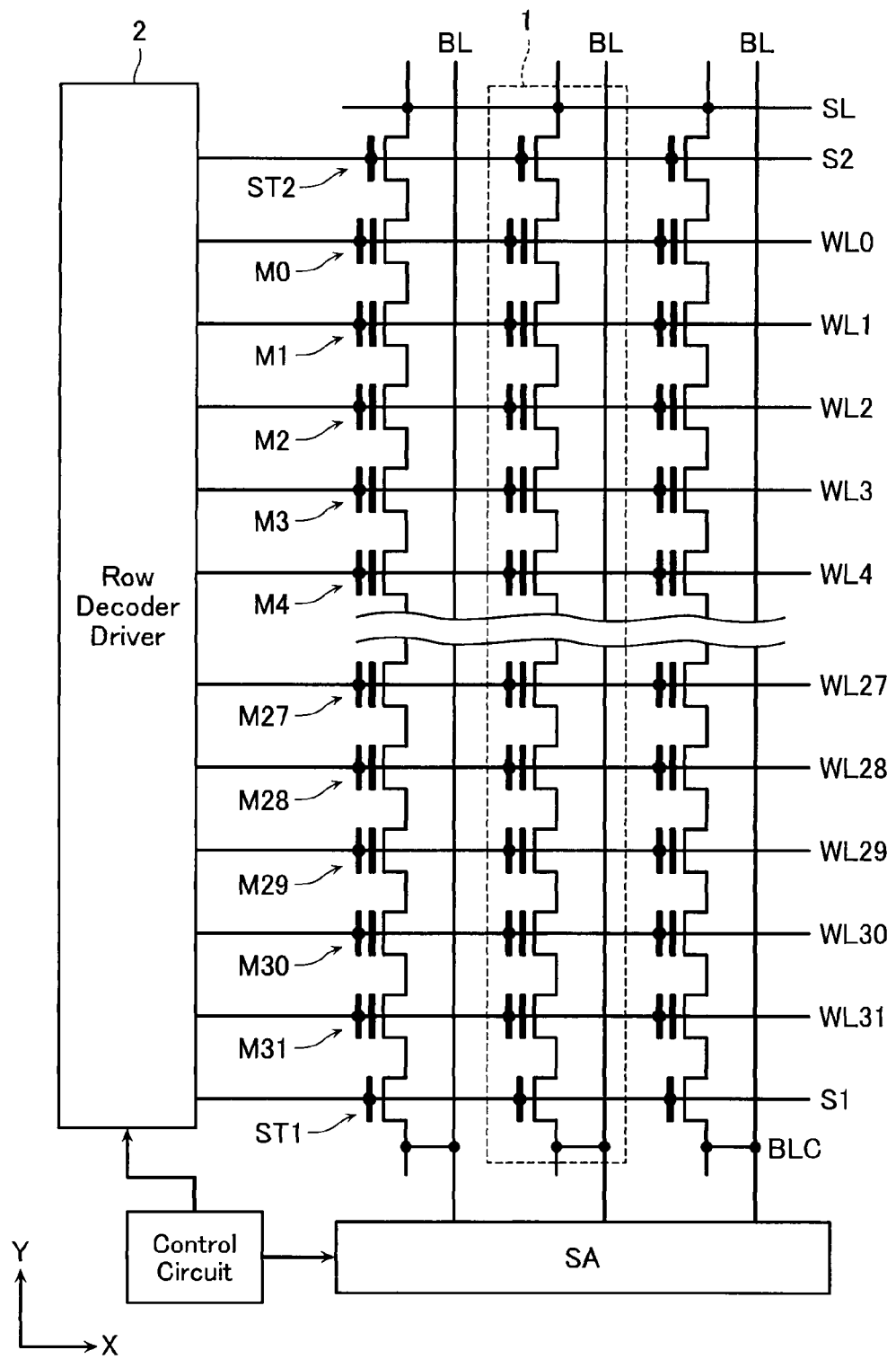
FIG. 1 is an equivalent circuit diagram illustrating a memory cell array in a non-volatile semiconductor storage device according to a first embodiment.
Figure 2:
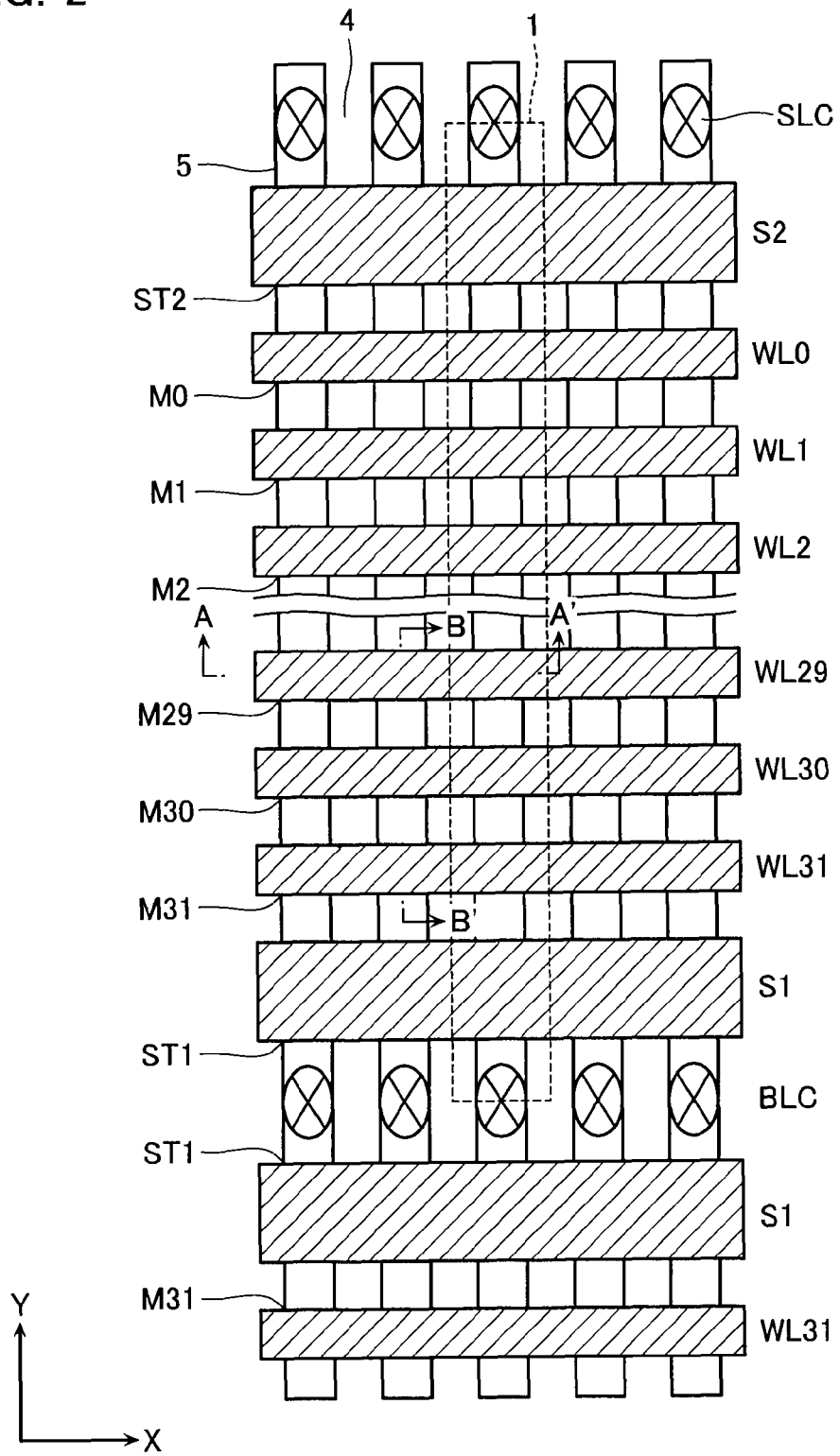
FIG. 2 is a layout diagram of a memory cell array in the non-volatile semiconductor storage device according to the first embodiment.

Referring now to FIGS. 1 to 3, a configuration of a non-volatile semiconductor storage device according to a first embodiment will be described below. As first, the description is made on a configuration of NAND-type flash memory of this embodiment.

FIG. 1 is an equivalent circuit diagram illustrating a part of a memory cell array formed in a memory cell region of the NAND-type flash memory. The NAND-type flash memory comprises NAND cell units 1, each including two select gate transistors ST1 and ST2 as well as a plurality of memory cells Mn (n=0 to 31) connected in series between the select gate transistors ST1 and ST2. In each NAND cell unit 1, a plurality of memory cells Mn share respective source/drain regions with adjacent ones to form a memory string. The memory cell array includes a plurality of NAND cell units 1 that are provided on a matrix.

In FIG. 1, the control gate electrodes of a plurality of memory cells Mn arranged in the X direction are commonly connected by a word line WLn (n=0 to 31). Also, in FIG. 1, the gate electrodes of a plurality of select gate transistors ST1 arranged in the X direction are commonly connected by a select gate line S1, while the gate electrodes of a plurality of select gate transistors ST2 are commonly connected by a select gate line S2. The select gate transistors ST1 have drain regions to which bit-line contacts BLC are connected. The bit-line contacts BLC are connected to bit lines BL extending in the Y direction of FIG. 1. In addition, the select gate transistors ST2 are connected via source regions to a source line SL extending in the X direction of FIG. 1. A sense amplifier circuit SA for use in reading and writing cell data is arranged at one ends of the bit lines BL. A row decoder/driver 2 that selects and drives the word lines WL and the select gate lines S1, S2 is arranged at one ends of the word lines WL. A control circuit controls the row decoder/driver 2 and the sense amplifier circuit SA.

It is assumed that a memory cell Mn has an N-type source/drain region that is formed in a P-type well on a silicon substrate, and a stacked gate structure that involves a control gate electrode and a floating gate electrode as an electric charge accumulation layer. The NAND-type flash memory changes a threshold voltage of a memory cell Mn by changing the amount of electric charges to be retained in this floating gate electrode for a write or erase operation, thereby storing 1-bit or multi-bit data in one memory cell. In the NAND-type flash memory, a set of multiple NAND cell units 1 sharing a word line WL is included in one block. A data erase operation of the NAND-type flash memory is performed on a block-by-block basis.

FIG. 2 is a layout diagram illustrating a part of a memory cell array formed in a memory cell region of the NAND-type flash memory.

As illustrated in FIG. 2, a plurality of device isolation regions 4 having a STI (Shallow Trench Isolation) structure are formed on a silicon substrate as a semiconductor substrate, at a certain interval and along the Y direction of FIG. 2.

As a result, device regions 5 are formed separately in the X direction of FIG. 2. Word lines WLn of memory cells Mn are formed at a certain interval and along the X direction of FIG. 2 orthogonal to the device regions 5. On those portions of the device regions 5 that intersect the word lines WLn, the word lines WLn provide control gate electrodes of the memory cells Mn. In addition, select gate lines S1 of the select gate transistors ST1 are formed along the X direction of FIG. 2. On those portions of the device regions 5 that intersect the select gate lines S1, the select gate lines S1 provide gate electrodes of the select gate transistors ST1. Bit-line contacts BLC are formed in the device regions 5 between adjacent select gate lines S1, respectively. The bit-line contacts BLC are connected to bit lines BL (not illustrated) extending in the Y direction of FIG. 2. In addition, select gate lines S2 of the select gate transistors ST2 are formed along the X direction of FIG. 2. On those portions of the device regions 5 that intersect the select gate lines S2, the select gate lines S2 provide gate electrodes of the select gate transistors ST2. Source-line contacts SLC are formed in the device regions 5 between adjacent select gate lines S2, respectively. The source-line contacts SLC are connected to a source line SL (not illustrated) extending in the X direction of FIG. 2.

FIGS. 3A and 3B illustrate cross-sectional views along lines A-A' and B-B' of FIG. 2.

As illustrated in FIG. 3A, device isolation trenches G are formed on a surface of a silicon substrate 3. Insulation films are buried in the device isolation trenches G to form device isolation regions 4. In the memory cell array of this embodiment, those portions of the silicon substrate 3 that are separated by a plurality of device isolation regions 4 having a STI structure provide device regions 5. Each of the device isolation regions 4 is formed in such a way that the top surface is higher than the surface of each of the device regions 5 and lower than the top surface of each of floating gate electrodes 8. Inter-gate insulation films 9 are formed in a continuous manner in the X direction of FIG. 3A. A control gate electrode 10 is disposed across device isolation regions 4 via the inter-gate insulation films 9.

As illustrated in FIG. 3B, a tunnel insulation film 7 is formed on the silicon substrate 3 as a gate insulation film with a film thickness of 4 nm to 16 nm. Each memory cell Mn is configured so that a floating gate electrode 8, an inter-gate insulation film 9, and a control gate electrode 10 are sequentially stacked via the tunnel insulation film 7. The floating gate electrodes 8 and the control gate electrodes 10 comprise, e.g., polysilicon films. The inter-gate insulation films 9 utilize, for example, an ONO structure including silicon oxide-silicon nitride-silicon oxide films, an NONON structure provided by sandwiching the ONO structure between silicon nitride films, and so on. Formed in the surface layers (surfaces) of the silicon substrate 3 between the floating gate electrodes 8 are impurity diffusion regions corresponding to source/drain regions 6. Each source/drain region 6 is formed to be shared between adjacent memory cells Mn. For example, silicon oxide films 11 are formed to be buried between the floating gate electrodes 8 and the control gate electrodes 10.

Figure 4A:
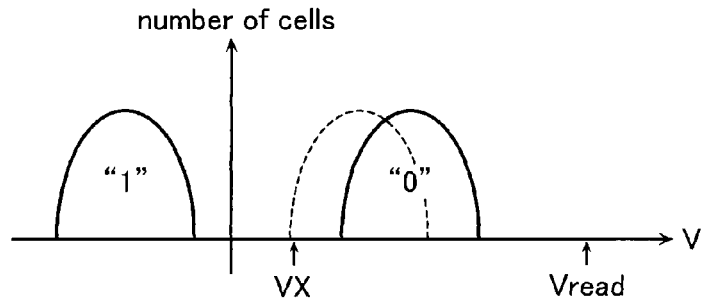
FIGS. 4A and 4B illustrate threshold voltage distributions of the non-volatile semiconductor storage device according to the first embodiment.
Figure 4B:
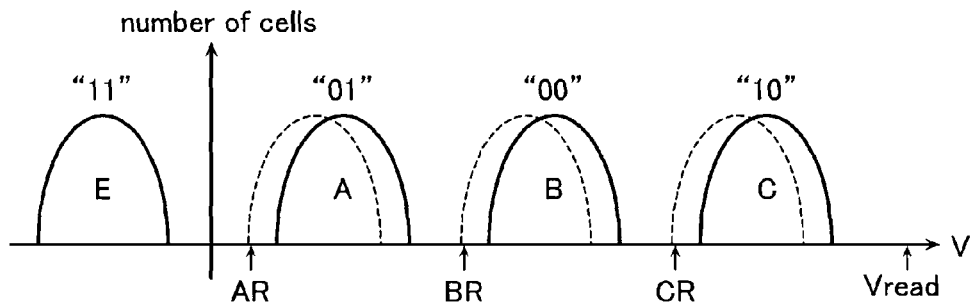

FIGS. 4A and 4B illustrate threshold voltage distributions of the NAND-type flash memory of this embodiment.

When the NAND-type flash memory of this embodiment stores binary data (1 bit/cell), the threshold voltage distributions of data are as illustrated in FIG. 4A. Data "1" (erase state) represents a state in which the threshold voltage is negative, while data "0" represents a state in which the threshold voltage is positive.

In a typical data read operation of the NAND-type flash memory, a read pass voltage Vread at which unselected memory cells become conductive irrespective of data is applied to unselected word lines WL in the memory cell array. In addition, a voltage Vcgrv between a plurality of threshold voltage distributions is applied to a selected word line WL connected to a selected memory cell Mn. For binary data storage, this voltage Vcgrv is set to a voltage VX (e.g., 3.5 V) as illustrated in FIG. 4A. In addition, a read pass voltage Vsg is applied to the select gate lines S1 and S2. Then, detection is made to determine whether or not current flows through a NAND cell unit 1 due to application of the voltages, thereby performing a data read operation.

In addition, when the NAND-type flash memory stores quaternary data (2 bits/cell), the threshold voltage distributions of data are as illustrated in FIG. 4B. In this case, four types of threshold voltage distributions (E, A, B, C) are provided, in order of lower to higher threshold voltage. Four different types of data "11", "01", "00", "10" are allocated to these threshold voltage distributions. Here, the threshold voltage distribution E represents a negative threshold voltage state obtained by performing a collective block erase operation.

In this read operation for quaternary data, the voltage value of the voltage Vcgrv between a plurality of threshold voltage distributions that is applied to the selected word line WL is set to a voltage AR, BR, or CR corresponding to four different threshold voltage distributions of a selected memory cell Mn. The voltage AR is the lowest voltage, and the voltage value becomes larger in order of BR, CR. Note that the voltage applied to unselected word lines WL during the read operation is the read pass voltage Vread that makes the unselected memory cells conductive irrespective of data. A data read operation is performed by detecting whether or not current flows through a NAND cell unit 1 when the voltage Vcgrv is any of the voltages AR, BR, and CR.

There is a problem with such a read operation of the NAND-type flash memory. That is, in order to allow sufficient current to flow through the unselected memory cells, such a voltage is used as the read pass voltage Vread that is higher than the highest threshold voltage (e.g., the upper limit of the threshold voltage distribution C) by, e.g., on the order of 2 V. In this case, the threshold voltage distribution of a selected memory cell Mn appears to decrease due to the effect of the read pass voltage Vread applied to adjacent unselected word lines WL. Accordingly, the threshold voltage distributions of the data stored by the NAND-type flash memory would be shifted in a negative direction, respectively, as indicated by broken lines of FIGS. 4A and 4B.

If a data read operation is performed under this condition, then the threshold voltage distribution of the selected memory cell Mn may not be read correctly. For example, for binary data storage, data "1" could be read from a selected memory cell even if the selected memory cell has a threshold voltage distribution of data "0". This is because the selected memory cell Mn becomes conductive due to the effect of the voltage Vread applied to the word line of a memory cell adjacent to the selected memory cell.

To prevent this, it is conceivable that a higher write voltage is applied to the selected word line WL when writing data to cause more electrons to be injected into floating gate electrodes 8. As a result, the threshold voltage distribution of the selected memory cell Mn is shifted to the right. Then, data can be read accurately even if the threshold voltage distribution is shifted to the left during a read operation. However, injecting many electrons into floating gate electrodes 8 should increase the amount of electrons that must be allowed to pass through the tunnel insulation film 7. This results in degradation of the tunnel insulation film 7, causing deterioration in reliability of the memory cells.

In addition, an upper limit of a threshold voltage distribution that can be written to memory cells is predetermined according to the configuration of the memory cells. That is, there is also an upper limit on the value of the write voltage to be applied to the selected word line WL.

Thus, as the write voltage becomes higher, it becomes harder and harder to ensure a sufficient breakdown voltage between the gate electrodes of the selected memory cell Mn and the adjacent memory cell, which also poses a problem preventing further miniaturization. To solve these problems, the non-volatile semiconductor storage device of this embodiment performs a read operation as described below.

[Operation of Non-Volatile Semiconductor Storage Device in First Embodiment]

Figure 5:
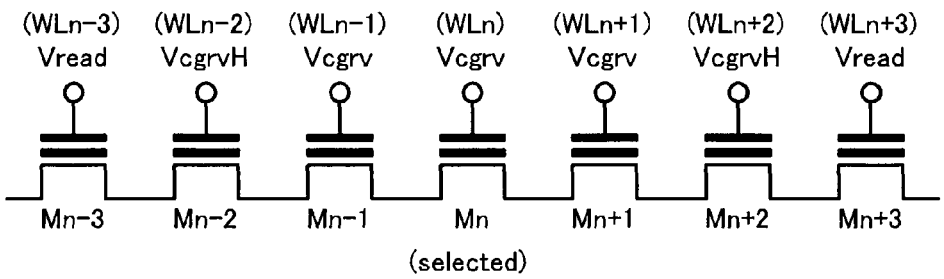
FIG. 5 illustrates how the non-volatile semiconductor storage device operates according to the first embodiment.

FIG. 5 illustrates a voltage application state of word lines WL in a NAND cell unit 1 during a read operation of the NAND-type flash memory according to this embodiment. In this embodiment, it is assumed that binary data as illustrated FIG. 4A is stored in a memory cell Mn. In this case, the voltage Vcgrv between a plurality of threshold voltage distributions is set to the voltage VX as illustrated in FIG. 4A. However, the following discussion is also applicable to a case where quaternary data is stored in the memory cell Mn. That is, the following discussion also describes the case of quaternary data storage in the memory cell Mn when the voltage Vcgrv between a plurality of threshold voltage distributions is set to the voltage AR, BR, or CR as illustrated in FIG. 4B.

As illustrated in FIG. 5, a voltage Vcgrv between a plurality of threshold voltage distributions is applied to the selected word line WLn connected to a selected memory cell Mn. The voltage Vcgrv is set to the voltage VX (e.g., 3.5 V) as illustrated in FIG. 4A for binary data storage. Although not illustrated in FIG. 5, a read pass voltage Vsg, which is as high as making the select gate transistors ST conductive, is applied to the select gate lines S1 and S2.

On the other hand, instead of applying the read pass voltage Vread to all of the unselected word lines, the following voltages are applied to the unselected word lines according to their positions relative to the selected memory cell. That is, a voltage Vcgrv, which is substantially the same as that applied to the selected word line WLn, is applied to both unselected word lines WLn+1 and WLn−1 adjacent to the selected word line WLn.

In addition, a voltage VcgrvH, which is not less than the read pass voltage Vread making unselected memory cells conductive irrespective of data, is applied to unselected word lines WLn+2 and WLn−2 adjacent to the unselected word lines WLn+1 and WLn−1. This voltage VcgrvH is set to, e.g., 8 V for binary data storage. In this case, the unselected memory cells Mn+1 and Mn−1 may not become conductive at the above-mentioned voltage Vcgrv depending on the data states of unselected memory cells Mn+1 and Mn−1. This can be the case, for example, when the voltage Vcgrv is the voltage AR and the threshold voltage of the unselected memory cell Mn+1 or Mn−1 falls within the highest threshold voltage distribution C in the case of FIG. 4B. However, due to the effect of the voltage VcgrvH applied to the unselected word lines WLn+2 and WLn−2, the unselected memory cells Mn+1 and Mn−1 become conductive regardless of their retaining data even if the voltage of the unselected word lines WLn+1 and WLn−1 is the voltage Vcgrv.

Then, the read pass voltage Vread at which unselected memory cells become conductive irrespective of data is applied to unselected word lines WLn+3 and WLn−3 adjacent to the unselected word lines WLn+2 and WLn−2, and to the other unselected word lines. The read pass voltage Vread, which is higher than the voltage Vcgrv, is set to, e.g., 6 V, for binary data storage.

The above-mentioned voltage values are only intended as an example in a read operation. A magnitude relation between the voltage values of respective voltages applied to the word lines WL only needs to be Vcgrv<Vread≦VcgrvH. The NAND-type flash memory of this embodiment applies these voltages to the word lines WL to perform a read operation.

Figure 6A:
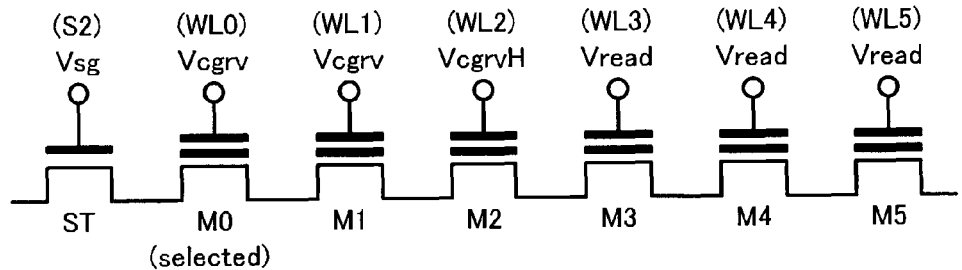
FIGS. 6A and 6B illustrate how the non-volatile semiconductor storage device operates according to the first embodiment.
Figure 6B:
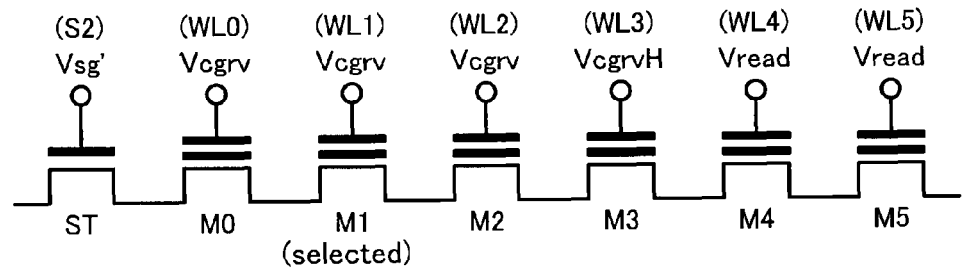

FIG. 5 illustrates a case where a memory cell Mn other than those close to the ends of the NAND cell unit 1 is read. Referring now to FIGS. 6A and 6B, the description will be made on an operation performed in the case of reading a memory cell close to an end of the NAND cell unit 1. FIG. 6A illustrates a case where a memory cell M0 located at an end of the NAND cell unit 1, i.e., adjacent to a select gate transistor ST, is selected in a read operation. In addition, FIG. 6B illustrates a case where a memory cell M1 that is located after one memory cell (M0) as viewed from the select gate transistor ST is selected. FIGS. 6A and 6B illustrate a case where a memory cell close to the source-side end is selected. However, this operation can also be performed in a similar manner when a memory cell close to the drain-side end is selected. As such, the following description will be only made on the case of selecting a memory cell close to the source-side end, omitting description of selecting a memory cell close to the drain-side end.

As illustrated in FIG. 6A, if the memory cell M0 is selected, a voltage Vcgrv is applied to a selected word line WL0 that is connected to the selected memory cell M0. A voltage Vcgrv, which is substantially the same as that applied to the selected word line WL0, is applied to an unselected word line WL1 that is adjacent to the selected word line WL0. On the other hand, a read pass voltage Vsg, which is as high as making the select gate transistor ST conductive, is applied to the select gate lines S1 and S2. In this case, the read pass voltage Vsg is set to a voltage at which the select gate transistor ST becomes conductive, and a shift of the threshold voltage distribution in the selected memory cell M0 is kept small.

In addition, a voltage VcgrvH, which is not less than the read pass voltage Vread, is applied to an unselected word line WL2 adjacent to the unselected word line WL1. In this case, due to the effect of the voltage VcgrvH applied to the unselected word line WL2, the unselected memory cell M1 becomes conductive regardless of its retaining data even if the voltage of the unselected word line WL1 is the voltage Vcgrv. Then, the read pass voltage Vread is applied to an unselected word line WL3 adjacent to the unselected word line WL2, and to the other unselected word lines (e.g., WL4 and WL5).

Next, as illustrated in FIG. 6B, if the memory cell M1 is selected, then the voltage Vcgrv is applied to the selected word line WL1 connected to the selected memory cell M1. The voltage Vcgrv, which is substantially the same as that applied to the selected word line WL1, is applied to the unselected word lines WL0 and WL2 adjacent to the selected word line WL1. The voltage VcgrvH, which is not less than the read pass voltage Vread, is applied to the unselected word line WL3 adjacent to the unselected word line WL2. In this case, due to the effect of the voltage VcgrvH applied to the unselected word line WL3, the unselected memory cell M2 becomes conductive regardless of its retaining data even if the voltage of the unselected word line WL2 is the voltage Vcgrv.

In addition, a read pass voltage Vsg' (>Vsg), which is as high as being able to make the select gate transistor ST as well as the memory cell M0 conductive, is applied to the select gate line S2. Then, a read pass voltage Vsg, which is as high as making the select gate transistor ST conductive, is applied to the select gate line S1. The read pass voltage Vread is applied to an unselected word line WL4 adjacent to the unselected word line WL3, and to the other unselected word lines (e.g., WL5).

[Advantages of Non-Volatile Semiconductor Storage Device in First Embodiment]

In the NAND-type flash memory according to this embodiment as illustrated in FIG. 5, the same voltage Vcgrv as applied to the selected word line WLn is applied to the unselected word lines WLn+1 and WLn−1 adjacent to a selected word line WLn. According to the inventor's knowledge, based on the simulation results from a self-manufactured simulator of the NAND-type flash memory having a minimum line width of approximately 34 nm, it has been found that the threshold voltage of a selected memory cell Mn appears to decrease by about 0.3 V when the voltage of the unselected word lines WLn+1 and WLn−1 adjacent to the selected word line WLn increases by 1 V. Therefore, the NAND-type flash memory according to this embodiment suppresses a shift of the threshold voltage in the selected memory cell Mn as compared with a case where the read pass voltage Vread is applied to the unselected word lines WLn+1 and WLn−1, like in the conventional memory. The degree of suppression is in proportion to the voltage difference Vread−Vcgrv. Through this voltage application, the unselected memory cells Mn−1 and Mn+1 may still become conductive due to the effect of the voltage VcgrvH applied to the unselected word lines WLn+2 and WLn−2.

Specifically, for binary data storage, the voltage to be applied to the selected word line WLn and the unselected word lines WLn+1 and WLn−1 is lower than the read pass voltage Vread by on the order of 2.5 V. The shift of the threshold voltage in the selected memory cell Mn is suppressed by on the order of 2.5×0.3=0.75 V, i.e., 750 mV. Therefore, it is not necessary to increase the write voltage to be applied to a selected word line WL excessively at the time of writing data for injecting many electrons into a floating gate electrode 8. This may provide the NAND-type flash memory that may ensure correct data read from a selected memory cell without deterioration in reliability of the memory cells.

In addition, as shrinking of memory cells Mn advances, the advantages of the non-volatile semiconductor storage device according to this embodiment will be more pronounced. As memory cells Mn are more shrunk, the distance between the memory cells Mn becomes shorter and shorter, and so does the distance between word lines WL. That is, a selected memory cell Mn is significantly affected by adjacent word lines WL at the time of reading data, and the threshold voltage of the selected memory cell Mn would have more dispersion. As a result, the probability of incorrect data increases in read operation. On the other hand, in the NAND-type flash memory according to this embodiment, the same voltage Vcgrv as applied to the selected word line WLn is applied to the adjacent unselected word lines WL. Consequently, the probability of incorrect read will not be increased as a shift of the threshold voltage in the selected memory cell Mn is suppressed even if memory cells Mn are shrunk.

In the case of FIGS. 6A and 6B, the voltage Vcgrv is also applied to the unselected word line WL1, or the unselected word lines WL0 and WL2, adjacent to the selected word line. Again, in the case of FIGS. 6A and 6B, a shift of the threshold voltage in the selected memory cell Mn is suppressed as compared with a case where the read pass voltage Vread is applied to unselected word lines, like in the conventional memory. The degree of suppression is in proportion to a voltage difference Vread−Vcgrv.

Second Embodiment

The non-volatile semiconductor storage device according to a second embodiment will now be described below. The configuration of the non-volatile semiconductor storage device according to the second embodiment is the same as that described in the first embodiment, and so will not be described again. In this embodiment, it is also assumed that binary data as illustrated in FIG. 4A is stored in a memory cell Mn. However, as in the first embodiment, the following discussion is also applicable to a case where quaternary data is stored in the memory cell Mn.

[Operation of Non-Volatile Semiconductor Storage Device in Second Embodiment]

Figure 7:
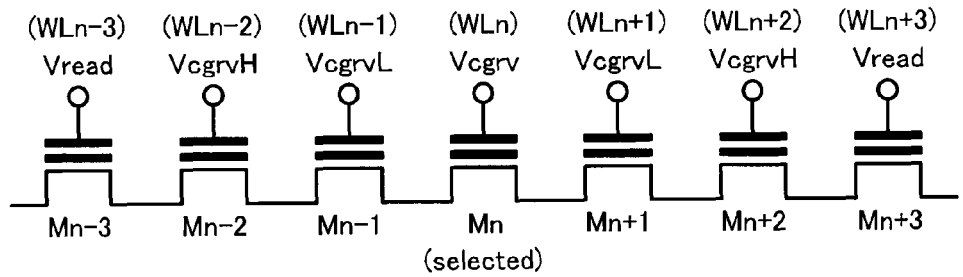
FIG. 7 illustrates how the non-volatile semiconductor storage device operates according to a second embodiment.

FIG. 7 illustrates a voltage application state of word lines WL in a NAND cell unit 1 during a read operation of the NAND-type flash memory according to this embodiment.

As illustrated in FIG. 7, a voltage Vcgrv between a plurality of threshold voltage distributions is applied to a selected word line WLn connected to a selected memory cell Mn. For binary data storage, this voltage Vcgrv is set to the voltage VX (e.g., 3.5 V) as illustrated in FIG. 4A. Although not illustrated in FIG. 7, a read pass voltage Vsg, which is as high as making the select gate transistor ST conductive, is applied to the select gate lines S1 and S2.

On the other hand, the following voltages are applied to the unselected word lines according to their positions relative to the selected memory cell. That is, a voltage VcgrvL, which is lower than the voltage Vcgrv, is applied to both unselected word lines WLn+1 and WLn−1 adjacent to the selected word line WLn. For binary data storage, this voltage VcgrvL is set to a voltage (e.g., 2.5 V) that is lower than the voltage Vcgrv by a certain voltage value.

In addition, a voltage VcgrvH, which is not less than the read pass voltage Vread making unselected memory cells conductive irrespective of data, is applied to unselected word lines WLn+2 and WLn−2 adjacent to the unselected word lines WLn+1 and WLn−1. This voltage VcgrvH is set to, e.g., 8 V for binary data storage. In this case, the unselected memory cells Mn+1 and Mn−1 may not become conductive at the above-mentioned voltage VcgrvL depending on the data states of unselected memory cells Mn+1 and Mn−1. However, due to the effect of the voltage VcgrvH applied to the unselected word lines WLn+2 and WLn−2, the unselected memory cells Mn+1 and Mn−1 become conductive regardless of their retaining data even if the voltage of the unselected word lines WLn+1 and WLn−1 is the voltage VcgrvL.

Then, the read pass voltage Vread at which the unselected memory cells become conductive irrespective of data is applied to unselected word lines WLn+3 and WLn−3 adjacent to the unselected word lines WLn+2 and WLn−2, and to the other unselected word lines. The read pass voltage Vread, which is higher than the voltage Vcgrv, is set to, e.g., 6 V, for binary data storage.

The above-mentioned voltage values are only intended as examples in a read operation. A magnitude relation between the voltage values of respective voltages applied to the word lines WL only needs to be VcgrvL<Vcgrv<Vread≦VcgrvH. The NAND-type flash memory of this embodiment applies these voltages to the word lines WL to perform a read operation.

Figure 8A:
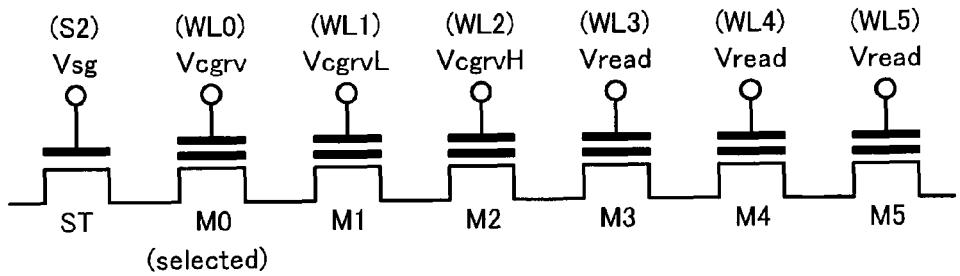
FIGS. 8A and 8B illustrate how the non-volatile semiconductor storage device operates according to a second embodiment.
Figure 8B:
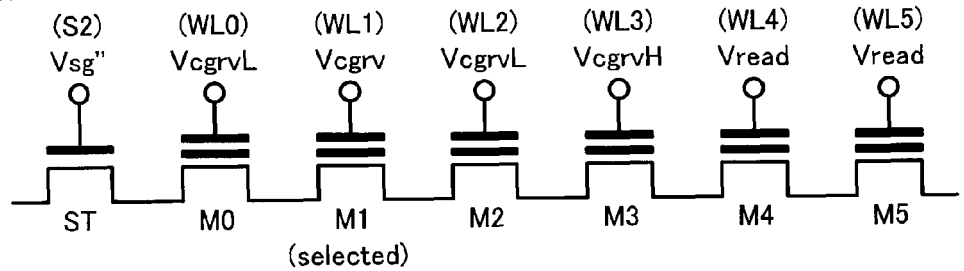

FIG. 7 illustrates a case where a memory cell Mn other than those close to the ends of the NAND cell unit 1 is read. Referring now to FIGS. 8A and 8B, the description will be made on an operation performed in the case of reading a memory cell close to an end of the NAND cell unit 1. FIG. 8A illustrates a case where a memory cell M0 located at an end of the NAND cell unit 1, i.e., adjacent to a select gate transistor ST, is selected in a read operation. In addition, FIG. 8B illustrates a case where a memory cell M1 that is located after one memory cell (M0) as viewed from the select gate transistor ST is selected. FIGS. 8A and 8B illustrate a case where a memory cell close to the source-side end is selected. However, this operation can also be performed in a similar manner when a memory cell close to the drain-side end is selected. As such, the following description will be only made on the case of selecting a memory cell close to the source-side end, omitting description of selecting a memory cell close to the drain-side end.

As illustrated in FIG. 8A, if the memory cell M0 is selected, a voltage Vcgrv is applied to a selected word line WL0 that is connected to the selected memory cell M0. A voltage VcgrvL, which is lower than the voltage Vcgrv, is applied to an unselected word line WL1 that is adjacent to the selected word line WL0. On the other hand, a read pass voltage Vsg, which is as high as making the select gate transistor ST conductive, is applied to the select gate lines S1 and S2. In this case, the read pass voltage Vsg is set to a voltage at which the select gate transistor ST becomes conductive, and a shift of the threshold voltage distribution in the selected memory cell M0 is kept small.

In addition, a voltage VcgrvH, which is not less than the read pass voltage Vread, is applied to an unselected word line WL2 adjacent to the unselected word line WL1. In this case, due to the effect of the voltage VcgrvH applied to the unselected word line WL2, the unselected memory cell M1 becomes conductive regardless of its retaining data even if the voltage of the unselected word line WL1 is the voltage VcgrvL. Then, the read pass voltage Vread is applied to an unselected word line WL3 adjacent to the unselected word line WL2, and to the other unselected word lines (e.g., WL4 and WL5).

Next, as illustrated in FIG. 8B, if the memory cell M1 is selected, then the voltage Vcgrv is applied to the selected word line WL1 connected to the selected memory cell M1. The voltage VcgrvL, which is lower than the voltage Vcgrv, is applied to the unselected word lines WL0 and WL2 adjacent to the selected word line WL1. The voltage VcgrvH, which is not less than the read pass voltage Vread, is applied to the unselected word line WL3 adjacent to the unselected word line WL2. In this case, due to the effect of the voltage VcgrvH applied to the unselected word line WL3, the unselected memory cell M2 becomes conductive regardless of its retaining data even if the voltage of the unselected word line WL2 is the voltage VcgrvL.

In addition, a read pass voltage Vsg" (>Vsg), which is as high as being able to make the select gate transistor ST as well as the memory cell M0 conductive, is applied to the select gate line S2. Then, a read pass voltage Vsg, which is as high as making the select gate transistor ST conductive, is applied to the select gate line S1. The read pass voltage Vread is applied to an unselected word line WL4 adjacent to the unselected word line WL3, and to the other unselected word lines (e.g., WL5).

[Advantages of Non-Volatile Semiconductor Storage Device in Second Embodiment]

In the NAND-type flash memory according to this embodiment as illustrated in FIG. 7, the voltage VcgrvL is applied to the unselected word lines WLn+1 and WLn−1 adjacent to a selected word line WLn. According to the inventor's knowledge, based on the simulation results from a self-manufactured simulator of the NAND-type flash memory having a minimum line width of 34 nm, it has been found that the threshold voltage of a selected memory cell Mn appears to decrease by about 0.3 V as the voltage of the unselected word lines WLn+1 and WLn−1 adjacent to the selected word line WLn increases by 1 V. Therefore, the NAND-type flash memory according to this embodiment suppresses a shift of the threshold voltage in the selected memory cell Mn as compared with a case where the read pass voltage Vread is applied to the unselected word lines WLn+1 and WLn−1, like in the conventional memory. The degree of suppression is in proportion to a voltage difference Vread−VcgrvL. Since the voltage VcgrvL is smaller than the voltage Vcgrv, a shift of the threshold voltage in the selected memory cell Mn would be suppressed.

Specifically, for binary data storage, the voltage to be applied to the selected word line WLn is lower than the read pass voltage Vread by on the order of 2.5 V. In addition, the voltage to be applied to the unselected word lines WLn+1 and WLn−1 is lower than the read pass voltage Vread by on the order of 3.5 V. That is, a shift of the threshold voltage in the selected memory cell Mn is suppressed by 2.5×0.3=0.75 V, i.e., 750 mV or more. Therefore, it is not necessary to increase the write voltage to be applied to a selected word line WL excessively at the time of writing data for injecting many electrons into a floating gate electrode 8. This may provide the NAND-type flash memory that may ensure correct data read from a selected memory cell without deterioration in reliability of the memory cells.

In the case of FIGS. 8A and 8B, the voltage VcgrvL is also applied to the unselected word line WL1, or the unselected word lines WL0 and WL2, adjacent to the selected word line. Again, in the case of FIGS. 8A and 8B, a shift of the threshold voltage in the selected memory cell Mn is suppressed as compared with a case where the read pass voltage Vread is applied to unselected word lines, like in the conventional memory. The degree of suppression is in proportion to a voltage difference Vread−VcgrvL.

Third Embodiment

[Configuration of Non-Volatile Semiconductor Storage Device in Third Embodiment]

Figure 9:
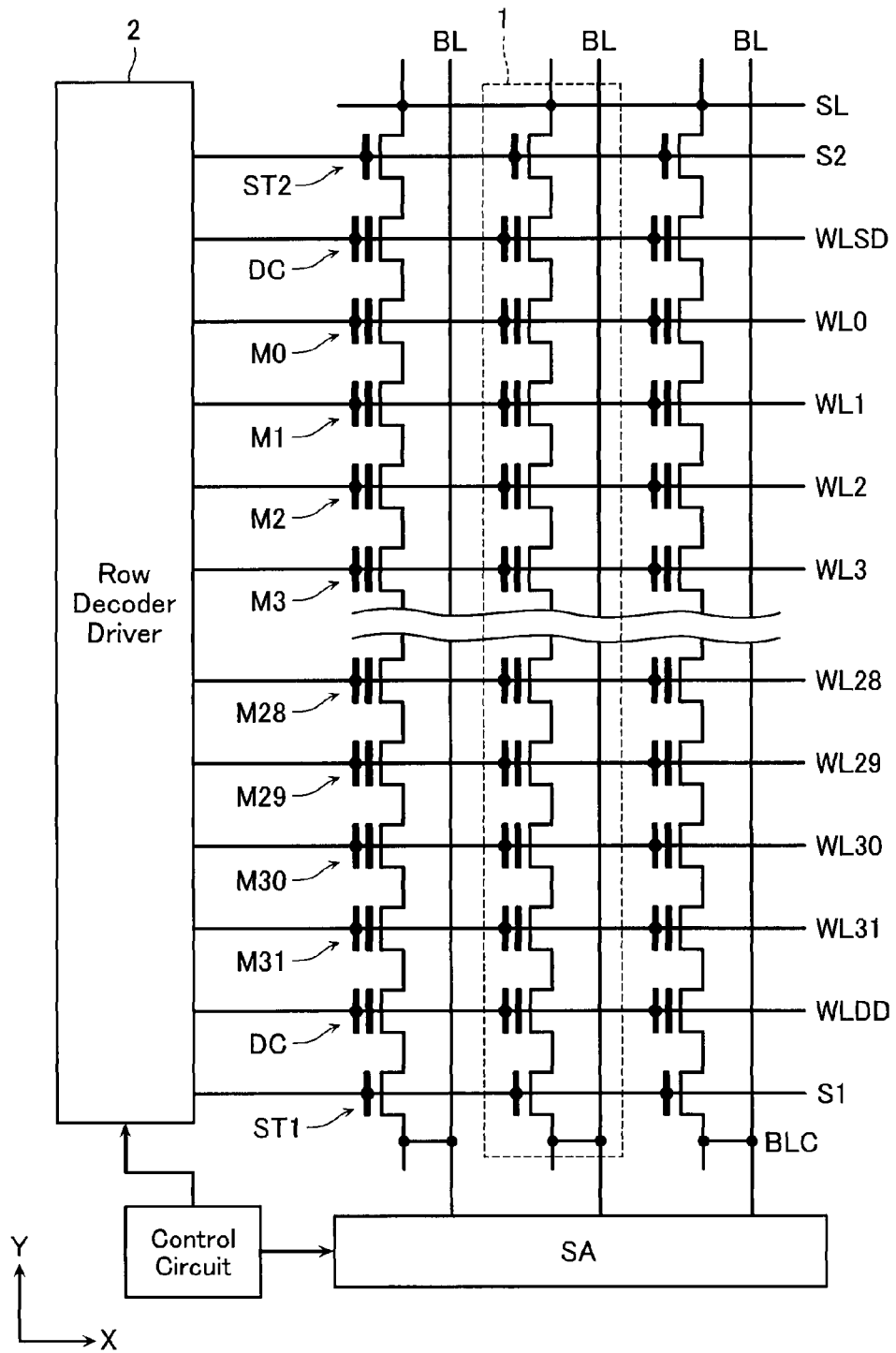
FIG. 9 is an equivalent circuit diagram illustrating a memory cell array in the non-volatile semiconductor storage device according to a third embodiment.

Referring now to FIG. 9, a configuration of the non-volatile semiconductor storage device according to the third embodiment will be described below.

FIG. 9 is an equivalent circuit diagram illustrating a part of a memory cell array formed in a memory cell region of the NAND-type flash memory of this embodiment. In this embodiment, those memory cells adjacent to the select gate transistors ST1 and ST2 in the NAND cell unit 1 of the NAND-type flash memory are dummy cells DC that are not used for data storage. If the memory cells M0 and M31 are directly connected to the select gate transistors ST1 and ST2, the memory cells M0 and M31 located at the ends of the NAND cell unit 1 and the other memory cells Mn could vary in operational characteristics. Providing dummy cells DC at the ends of the NAND cell unit 1 that are not used in a normal operation for storing data may contribute to uniform characteristics of memory cells Mn. For binary data storage, for example, the threshold voltage distribution of a dummy cells DC is set to the threshold voltage distribution of "1" data as illustrated in FIG. 4A. In addition, for quaternary data storage, the threshold voltage distribution of a dummy cells DC is set to the threshold voltage distribution E or A as illustrated in FIG. 4B. The control gate electrodes of a plurality of dummy cells DC arranged in the X direction in FIG. 9 are commonly connected by a drain-side dummy word line WLDD or a source-side dummy word line WLSD.

The configurations of the other components, such as the word lines WLn (n=0 to 31), the select gate lines S1, S2, the bit lines BL, the source line SL, the sense amplifier circuit SA, or the row decoder/driver 2, are similar to those described in the first embodiment as illustrated in FIG. 1. In addition, in this embodiment, it is also assumed that binary data as illustrated FIG. 4A is stored in a memory cell Mn. However, as in the first and second embodiments, the following discussion is also applicable to a case where quaternary data is stored in the memory cell Mn.

[Operation of Non-Volatile Semiconductor Storage Device in Third Embodiment]

Figure 10:
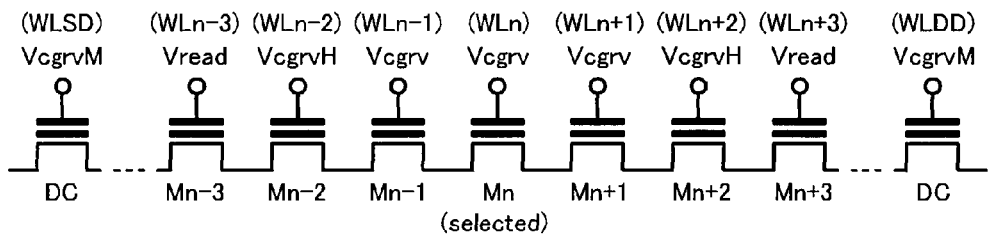
FIG. 10 illustrates how the non-volatile semiconductor storage device operates according to the third embodiment.

FIG. 10 illustrates a voltage application state of word lines WL in a NAND cell unit 1 during a read operation of the NAND-type flash memory according to this embodiment. In a read operation of the NAND-type flash memory of this embodiment, if data is read from a selected memory cell Mn other than those close to the ends of the NAND cell unit 1, then the voltage application state of the word lines WL is similar to that illustrated in FIG. 5.

That is, a voltage Vcgrv between a plurality of threshold voltage distributions is applied to a selected word line WLn connected to the selected memory cell Mn. In addition, a voltage Vcgrv, which is substantially the same as that applied to the selected word line WLn, is applied to both unselected word lines WLn+1 and WLn−1 adjacent to the selected word line WLn. A voltage VcgrvH, which is not less than the read pass voltage Vread, is applied to unselected word lines WLn+2 and WLn−2 adjacent to the unselected word lines WLn+1 and WLn−1. Then, the read pass voltage Vread is applied to unselected word lines WLn+3 and WLn−3 adjacent to the unselected word lines WLn+2 and WLn−2, and to the other unselected word lines. At this point, a voltage VcgrvM, which is sufficiently high for the dummy cells DC to become conductive, is applied to the dummy word lines WLDD and WLSD connected to the dummy cells DC. Since the threshold voltage distribution of the dummy cells DC is set to either the threshold voltage distribution E or A, the voltage VcgrvM may be smaller than the voltage Vread. Although not illustrated in FIG. 10, a read pass voltage Vsg, which is as high as making the select gate transistor ST conductive, is applied to the select gate lines S1 and S2.

The NAND-type flash memory of this embodiment applies these voltages to the word lines WL to perform a read operation when reading data from a selected memory cell Mn other than those close to the ends of the NAND cell unit 1.

Figure 11A:
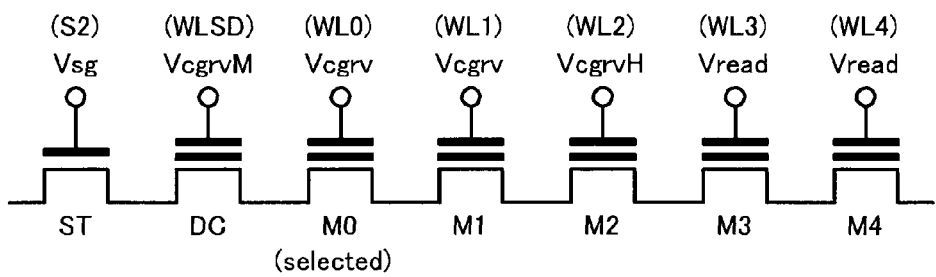
FIGS. 11A and 11B illustrate how the non-volatile semiconductor storage device operates according to the third embodiment.
Figure 11B:
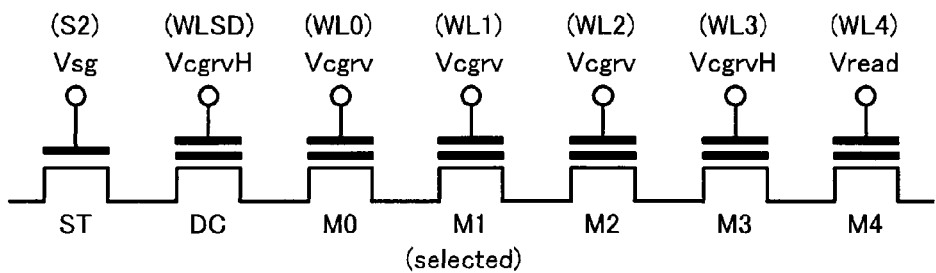

FIG. 10 illustrates a case where a memory cell Mn other than those close to the ends of the NAND cell unit 1 is read. Referring now to FIGS. 11A and 11B, the description will be made on an operation performed in the case of reading a memory cell close to an end of the NAND cell unit 1. FIG. 11A illustrates a case where a memory cell M0 located at an end of the NAND cell unit 1, i.e., adjacent to a dummy cell DC is selected in a read operation. In addition, FIG. 11B illustrates a case where a memory cell M1 that is located after one memory cell (M0) as viewed from the dummy cell DC is selected. FIGS. 11A and 11B illustrate a case of selecting a memory cell close to the source-side end. However, this operation may also be performed in a similar manner when a memory cell close to the drain-side end is selected. As such, the following description will be only made on the case of selecting a memory cell close to the source-side end, omitting description of selecting a memory cell close to the drain-side end.

As illustrated in FIG. 11A, if a memory cell M0 is selected, then a voltage Vcgrv is applied to a selected word line WL0 connected to the selected memory cell M0. A voltage Vcgrv, which is substantially the same as that applied to the selected word line WL0, is applied to an unselected word line WL1 adjacent to the selected word line WL0. On the other hand, a voltage VcgrvM, which is as high as making the dummy cells DC conductive, is applied to dummy word lines WLDD and WLSD. Since the threshold voltage distribution of the dummy cells DC is set to either the threshold voltage distribution E or A, the voltage value of the voltage VcgrvM may be set to a value lower than the read pass voltage Vread.

In addition, a voltage VcgrvH, which is not less than the read pass voltage Vread, is applied to an unselected word line WL2 adjacent to the unselected word line WL1. In this case, due to the effect of the voltage VcgrvH applied to the unselected word line WL2, the unselected memory cell M1 becomes conductive regardless of its retaining data even if the voltage of the unselected word line WL1 is the voltage Vcgrv. On the other hand, a voltage Vsg, which is as high as making the select gate transistor ST conductive, is applied to the select gate lines S1 and S2. Then, the read pass voltage Vread is applied to an unselected word line WL3 adjacent to the unselected word line WL2, and to the other unselected word lines (e.g., WL4).

Next, as illustrated in FIG. 11B, if a memory cell M1 is selected, then the voltage Vcgrv is applied to a selected word line WL1 connected to the selected memory cell M1. A voltage Vcgrv, which is substantially the same as that applied to the selected word line WL1, is applied to unselected word lines WL0 and WL2 adjacent to the selected word line WL1. A voltage VcgrvH, which is not less than the read pass voltage Vread, is applied to an unselected word line WL3 adjacent to the unselected word line WL2. In addition, the voltage VcgrvH, which makes the dummy cell DC conductive and is not less than the read pass voltage Vread, is applied to the dummy word line WLSD. In this case, due to the effect of the voltage VcgrvH applied to the unselected word line WL3 and the dummy word line WLSD, the unselected memory cells M0 and M2 become conductive regardless of their retaining data even if the voltage of the unselected word lines WL0 and WL2 is the voltage Vcgrv.

In addition, a read pass voltage Vsg, which is as high as making the select gate transistor ST conductive, is applied to the select gate lines S1 and S2. The read pass voltage Vread is applied to an unselected word line WL4 adjacent to the unselected word line WL3, and to the other unselected word lines WL. A voltage VcgrvM, which is as high as making the dummy cell DC conductive, or a voltage VcgrvH, which is not less than the read pass voltage Vread, may be applied to the dummy word line WLDD.

Figure 12:
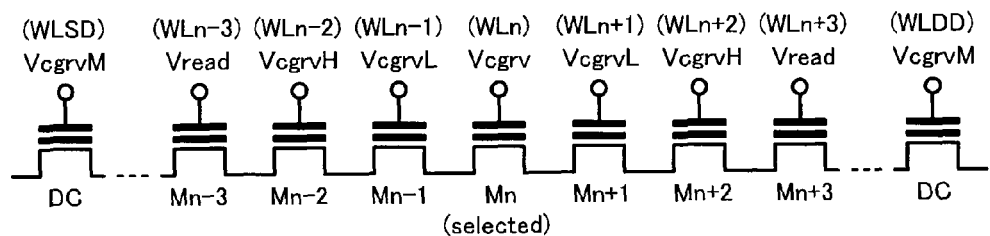
FIG. 12 illustrates how the non-volatile semiconductor storage device operates according to the third embodiment.

FIG. 12 illustrates a state where voltages are applied to word lines WL when a method similar to that illustrated in FIG. 7 is carried out in a read operation of the NAND-type flash memory according to this embodiment.

That is, a voltage Vcgrv between a plurality of threshold voltage distributions is applied to a selected word line WLn connected to a selected memory cell Mn. In addition, a voltage VcgrvL, which is lower than the voltage Vcgrv, is applied to both unselected word lines WLn+1 and WLn−1 adjacent to a selected word line WLn. A voltage VcgrvH, which is not less than the read pass voltage Vread, is applied to unselected word lines WLn+2 and WLn−2 adjacent to the unselected word lines WLn+1 and WLn−1. Then, the read pass voltage Vread is applied to unselected word lines WLn+3 and WLn−3 adjacent to the unselected word lines WLn+2 and WLn−2, and to the other unselected word lines. At this point, a voltage VcgrvM, which is sufficiently high for the dummy cells DC to become conductive, is applied to the dummy word lines WLDD and WLSD connected to the dummy cells DC. Since the threshold voltage distribution of the dummy cells DC is set to either the threshold voltage distribution E or A, the voltage VcgrvM may be smaller than the voltage Vread. Although not illustrated in FIG. 12, a read pass voltage Vsg, which is as high as making the select gate transistor ST conductive, is applied to the select gate lines S1 and S2.

The NAND-type flash memory of this embodiment may apply these voltages to the word lines WL to perform a read operation when reading data from a selected memory cell Mn other than those close to the ends of the NAND cell unit 1.

Figure 13A:
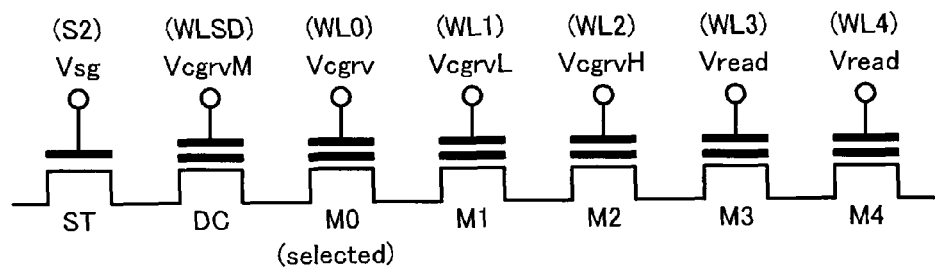
FIGS. 13A and 13B illustrate how the non-volatile semiconductor storage device operates according to the third embodiment.
Figure 13B:
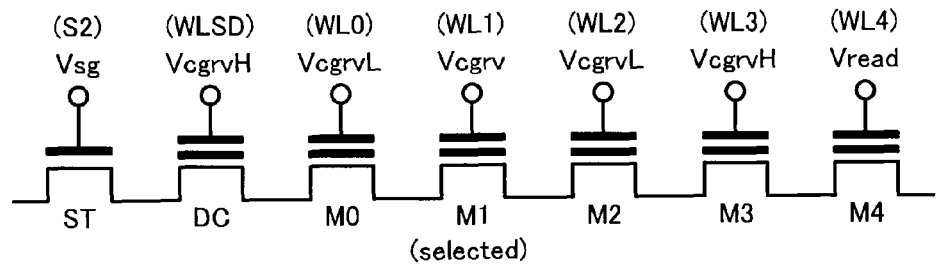

FIG. 12 illustrates a case where a memory cell Mn other than those close to the ends of the NAND cell unit 1 is read. Referring now to FIGS. 13A and 13B, the description will be made on an operation performed in the case of reading a memory cell close to an end of the NAND cell unit 1. FIG. 13A illustrates a case where a memory cell M0 located at an end of the NAND cell unit 1, i.e., adjacent to a dummy cell DC, is selected when a read operation is performed at the NAND-type flash memory of the third embodiment as illustrated in FIG. 12. In addition, FIG. 13B illustrates a case where a memory cell M1 that is located after one memory cell (M0) as viewed from the dummy cell DC is selected when a read operation is performed as illustrated in FIG. 12.

As illustrated in FIG. 13A, if a memory cell M0 is selected, then a voltage Vcgrv is applied to a selected word line WL0 connected to the selected memory cell M0. A voltage VcgrvL, which is lower than the voltage Vcgrv, is applied to an unselected word line WL1 adjacent to the selected word line WL0. On the other hand, a voltage VcgrvM, which is as high as making the dummy cells DC conductive, is applied to dummy word lines WLDD and WLSD. Since the threshold voltage distribution of the dummy cells DC is set to either the threshold voltage distribution E or A, the voltage value of the voltage VcgrvM may be set to a value that is, for example, not less than the voltage VcgrvL and lower than the read pass voltage Vread.

In addition, a voltage VcgrvH, which is not less than the read pass voltage Vread, is applied to an unselected word line WL2 adjacent to the unselected word line WL1. In this case, due to the effect of the voltage VcgrvH applied to the unselected word line WL2, the unselected memory cell M1 becomes conductive regardless of its retaining data even if the voltage of the unselected word line WL1 is the voltage VcgrvL. On the other hand, a voltage Vsg, which is as high as making the select gate transistor ST conductive, is applied to the select gate lines S1 and S2. Then, the read pass voltage Vread is applied to an unselected word line WL3 adjacent to the unselected word line WL2, and to the other unselected word lines (e.g., WL4).

Next, as illustrated in FIG. 13B, if a memory cell M1 is selected, then a voltage Vcgrv is applied to a selected word line WL1 connected to the selected memory cell M1. A voltage VcgrvL, which is lower than the voltage Vcgrv, is applied to unselected word lines WL0 and WL2 adjacent to the selected word line WL1. A voltage VcgrvH, which is not less than the read pass voltage Vread, is applied to an unselected word line WL3 adjacent to the unselected word line WL2. In addition, a voltage VcgrvH, which makes the dummy cell DC conductive and is not less than the read pass voltage Vread, is applied to the dummy word line WLSD. In this case, due to the effect of the voltage VcgrvH applied to the unselected word line WL3 and the dummy word line WLSD, the unselected memory cells M0 and M2 become conductive regardless of their retaining data even if the voltage of the unselected word lines WL0 and WL2 is the voltage VcgrvL.

In addition, a read pass voltage Vsg, which is as high as making the select gate transistor ST conductive, is applied to the select gate line S1 and S2. The read pass voltage Vread is applied to an unselected word line WL4 adjacent to the unselected word line WL3, and to the other unselected word lines WL. A voltage VcgrvM, which is as high as making the dummy cell DC conductive, or a voltage VcgrvH, which is not less than the read pass voltage Vread, may be applied to the dummy word line WLDD.

[Advantages of Non-Volatile Semiconductor Storage Device in Third Embodiment]

The NAND-type flash memory according to this embodiment also suppresses a shift of the threshold voltage distribution in a selected memory cell Mn during a read operation. Therefore, it is not necessary to increase the write voltage to be applied to a selected word line WL excessively at the time of writing data for injecting many electrons into a floating gate electrode 8. This may provide the NAND-type flash memory that may ensure correct data read from a selected memory cell without deterioration in reliability of the memory cells.

In addition, in the case of FIG. 13B, if a memory cell M1 is selected that is located next but one to the dummy cell DC, then the voltage VcgrvL is applied to the unselected memory cell M0 adjacent to the dummy cell DC, while the voltage VcgrvH is applied to the dummy word line WLDD. On the other hand, in the case of reading the same memory cell M1 as illustrated in FIG. 6B, a read pass voltage Vsg' (>Vsg), which is as high as being able to make the memory cell M0 conductive, is applied to the select gate line S2. That is, it is preferable to apply a voltage as high as the voltage VcgrvH to a select gate transistor ST. If such a high voltage is applied to the gate electrode of the select gate transistor, the reliability of the gate insulation film of the select gate transistor may deteriorate. However, in the NAND-type flash memory according to this embodiment, the voltage VcgrvH is applied to dummy cells DC having the same structure as memory cells MC, and a normal read pass voltage Vsg is applied to a gate electrode of a select gate transistor ST. This may improve the reliability of the select gate transistor.

Note that in the case of FIGS. 13A and 13B, a magnitude relation between the voltage values of respective voltages applied to the word lines WL only needs to be VcgrvL≦VcgrvM<Vread≦VcgrvH.

While embodiments of the present invention have been described, various variations of these embodiments are possible. Variations of the embodiments are described as follows.

(Variation of Second Embodiment)

The following description is made on the non-volatile semiconductor storage device according to a variation of the second embodiment. The operation of the non-volatile semiconductor storage device according to this variation is the same as that described in the second embodiment illustrated in FIG. 7. That is, the operation is assumed to involve applying a voltage Vcgrv to a selected word line WLn, a voltage VcgrvL to unselected word lines WLn+1 and WLn−1, and a voltage VcgrvH to unselected word lines WLn+2 and WLn−2, respectively. It is also assumed that the NAND-type flash memory according to this variation stores multi-value data as illustrated in FIG. 4B in each memory cell. That is, in a read operation, a voltage Vcgrv between a plurality of threshold voltage distributions is set to the voltage AR, BR, or CR as illustrated in FIG. 4B.

When performing a read operation, the non-volatile semiconductor storage device according to the variation changes the voltage value of the voltage VcgrvL while changing a voltage Vcgrv between a plurality of threshold voltage distributions from one voltage, such as AR, BR or CR, to another. Similarly, when performing a read operation, the non-volatile semiconductor storage device changes the voltage value of the voltage VcgrvH while changing a voltage Vcgrv between a plurality of threshold voltage distributions. That is, it performs a read operation by changing the voltage to be applied to the word lines WL, while maintaining a magnitude relation between the voltage values of respective voltages applied to the word lines WL, VcgrvL<Vcgrv<Vread≦VcgrvH.

[Operation]

Figure 14:
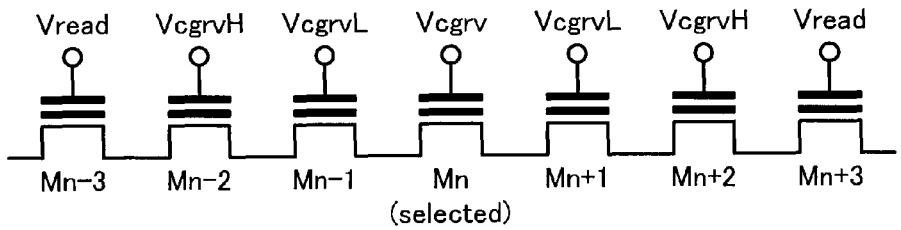
FIG. 14 illustrates how the non-volatile semiconductor storage device operates according to a variation.

FIG. 14 illustrates a voltage application state of word lines WL when data is read from a memory cell Mn other than those close to the ends of the NAND cell unit 1 during a read operation of the NAND-type flash memory according to this variation.

As illustrated in FIG. 14, a voltage Vcgrv between a plurality of threshold voltage distributions is applied to a selected word line WLn connected to the selected memory cell Mn. For quaternary data storage, this voltage Vcgrv is set to the voltage AR, BR, or CR between respective threshold voltage distributions. For illustrative purposes, it is assumed here that the voltages AR, BR, and CR are 0 V, 1 V, and 2 V, respectively. These voltages Vcgrv (0 V, 1 V, 2 V) are sequentially applied to the selected word line WLn, and data is read depending on whether or not current flows through the NAND cell unit 1.

A voltage VcgrvL, which is lower than the voltage Vcgrv, is applied to both unselected word lines WLn+1 and WLn−1 adjacent to the selected word line WLn. The voltage VcgrvL may change from, for example, −1 V to 0 V to 1 V while the voltage Vcgrv changes from 0 V to 1 V to 2 V, so that a voltage difference between the voltage Vcgrv and the voltage VcgrvL is constant (see, ex.1 and ex.2 in FIG. 14). The voltage VcgrvL may also be fixed at a certain voltage value (e.g., −1 V) while the voltage Vcgrv changes from 0 V to 1 V to 2 V (see, ex.3 and ex.4 in FIG. 14).

A voltage VcgrvH, which is not less than the read pass voltage Vread, is applied to unselected word lines WLn+2 and WLn−2 adjacent to the unselected word lines WLn+1 and WLn−1. The voltage VcgrvH may change from, for example, 8 V to 7 V to 6 V while the voltage Vcgrv changes from 0 V to 1 V to 2 V (see, ex.1 and ex.3 in FIG. 14). The voltage VcgrvH may also be fixed at a certain voltage value (e.g., 8 V) while the voltage Vcgrv changes from 0 V to 1 V to 2 V (see, ex.2 and ex.4 in FIG. 14).

That is, the voltages VcgrvL and VcgrvH may be changed, respectively, when a read operation is performed by changing the voltage Vcgrv, as long as a magnitude relation between the voltage values of respective voltages applied to the word lines WL, VcgrvL<Vcgrv<Vread≦VcgrvH, is maintained. The NAND-type flash memory of this variation applies these voltages to the word lines WL to perform a read operation.

[Advantages]

The NAND-type flash memory according to the variation also suppresses a shift of the threshold voltage distribution in a selected memory cell Mn during a read operation. Therefore, it is not necessary to increase the write voltage to be applied to a selected word line WL excessively at the time of writing data for injecting many electrons into a floating gate electrode 8. This may provide the NAND-type flash memory that may ensure correct data read from a selected memory cell without deterioration in reliability of the memory cells. According to the variation, dummy cells DC may or may not be provided at the NAND cell unit 1.

(Variation of First and Second Embodiments)

The non-volatile semiconductor storage device according to a variation of the first and second embodiments will now be described below. The NAND-type flash memory according to this variation stores multi-value data as illustrated in FIG. 4B in each memory cell. That is, in a read operation, a voltage Vcgrv between a plurality of threshold voltage distributions is set to the voltage AR, BR, or CR as illustrated in FIG. 4B.

When the voltage Vcgrv to be applied to a selected word line WLn is set not less than a certain voltage value, the non-volatile semiconductor storage device according to the variation performs a voltage application method as illustrated in FIGS. 5 and 7 according to the first and second embodiments. Alternatively, when the voltage Vcgrv to be applied to the selected word line WLn is set below a certain voltage value, a normal read operation is performed and the read pass voltage Vread is applied to all of the unselected word lines.

[Operation]

Figure 15A:
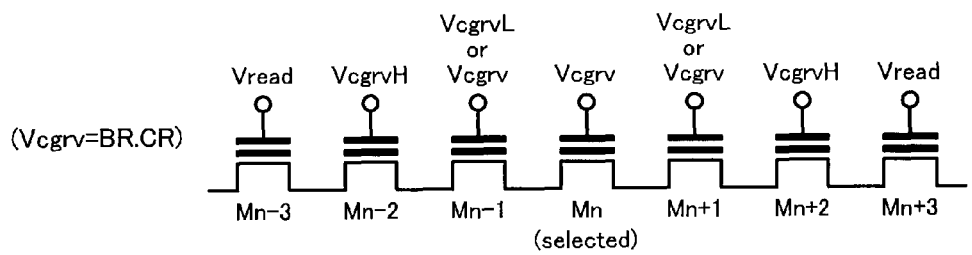
FIGS. 15A and 15B illustrate how the non-volatile semiconductor storage device operates according to a variation.
Figure 15B:
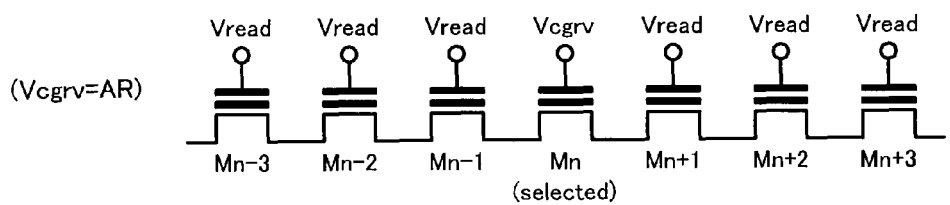

FIGS. 15A and 15B illustrates a voltage application state of word lines WL when data is read from a selected memory cell Mn other than those close to the ends of the NAND cell unit 1 during a read operation of the NAND-type flash memory according to this variation.

As illustrated in FIG. 15A, in a read operation of the variation, a voltage Vcgrv or a voltage VcgrvL lower than the voltage Vcgrv is applied to unselected word lines WLn+1 and WLn−1 when the voltage Vcgrv to be applied to a selected word line WLn is set to a voltage (voltage BR or CR) not less than a certain voltage value. In addition, a voltage VcgrvH, which is not less than the read pass voltage Vread, is applied to unselected word lines WLn+2 and WLn−2 when the voltage Vcgrv to be applied to the selected word line WLn is set to the voltage BR or CR. The NAND-type flash memory in this example applies these voltages to the word lines WL to perform a read operation.

In contrast, as illustrated in FIG. 15B, when the voltage Vcgrv to be applied to the selected word line WLn is set to the voltage AR, a normal read operation is performed and the read pass voltage Vread is applied to all of the unselected word lines.

[Advantages]

The NAND-type flash memory according to the variation also suppresses a shift of the threshold voltage distribution in a selected memory cell Mn during a read operation. Therefore, it is not necessary to increase the write voltage to be applied to a selected word line WL excessively at the time of writing data for injecting many electrons into a floating gate electrode 8. This may provide the NAND-type flash memory that may ensure correct data read from a selected memory cell without deterioration in reliability of the memory cells.

When data is read by applying a voltage (e.g., voltage AR) smaller than a certain voltage value to a selected word line WLn (e.g., the voltage application state is as illustrated in FIG. 15A), then the value of the voltage applied to unselected word lines WLn+1 and WLn−1 is equal to or smaller than the voltage value of the voltage AR. If the threshold voltage of the unselected memory cells Mn+1 and Mn−1 is high (e.g., if it falls within the threshold voltage distribution C), then the unselected memory cells Mn+1 and Mn−1 could not be made conductive by applying the voltage VcgrvH to unselected word lines WLn+2 and WLn−2. Therefore, providing a voltage application state as illustrated FIGS. 15A and 15B only when the voltage Vcgrv is set to the voltage BR or CR may ensure correct data read from a selected memory cell Mn.

To which voltage the voltage Vcgrv should be set may be arbitrarily changed for assuming a voltage application state as illustrated in FIG. 15A. In the above examples, for quaternary data storage, the voltage Vcgrv or VcgrvL is applied to unselected word lines WLn+1 and WLn−1 and the voltage VcgrvH is applied to unselected word lines WLn+2 and WLn−2 when the voltage Vcgrv is set to the voltage BR or CR. However, other configurations may also be possible where the voltage Vcgrv or VcgrvL is applied to the unselected word lines WLn+1 and WLn−1 and the voltage VcgrvH is applied to the unselected word lines WLn+2 and WLn−2 only when the voltage Vcgrv is set to the voltage CR.

[Others]

While embodiments of the present invention have been described, the present invention is not intended to be limited to the disclosed embodiments, and various other changes, additions or the like may be made thereto and any combination thereof may be used without departing from the spirit of the invention. For example, the number of memory cells Mn that are connected in series between the select transistors ST1 and ST2 only needs to be plural and is not limited to 32. In addition, while the embodiments have been described in the context of binary or quaternary data being stored in each memory cell, any other value data (e.g., octal data) may be stored in the memory cell. Furthermore, while the operation of the NAND-type flash memory has been described as a read operation in the above embodiments, it may be a write verify operation to verify whether a write operation is successfully performed. In that case, the voltage Vcgrv would be a verify voltage that is selected as a lower limit of the threshold voltage distribution to be written.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor storage device comprising:
    a memory cell array including an array of NAND cell units, each of the NAND cell units including a memory string having a plurality of non-volatile memory cells connected in series and select transistors each connected to an end of the memory string;
    word lines each connected to a control gate electrode of each of the non-volatile memory cells;
    bit lines each connected to a first end of each of the NAND cell units;
    a source line connected to a second end of each of the NAND cell units; and
    a control circuit configured to control a data read operation by selecting one of the non-volatile memory cells as a selected memory cell,
    the non-volatile memory cells being provided with a plurality of threshold voltage distributions allocated corresponding to multiple pieces of data to be stored,
    when performing the data read operation, the control circuit being configured to:
        apply a first voltage to a selected word line as one of the word lines that is connected to the selected memory cell, the first voltage being a voltage between the plurality of threshold voltage distributions;

apply a second voltage to a first unselected word line as one of the word lines adjacent to the selected word line, the second voltage being not more than the first voltage;

apply a third voltage to a second unselected word line as one of the word lines adjacent to the first unselected word line, the third voltage being not less than a read pass voltage at which the non-volatile memory cells may become conductive irrespective of the plurality of threshold voltage distributions provided thereto; and apply the read pass voltage to a third unselected word line, the third unselected word line being an unselected word line other than the first unselected word line and the second unselected word line.

2. The non-volatile semiconductor storage device according to claim 1, wherein one of the non-volatile memory cells adjacent to the select transistor in each of the NAND cell units is a dummy cell that is not used for data storage, and when performing the data read operation, the control circuit is configured to apply a fourth voltage at which the dummy cell may become conductive to a dummy word line connected to the dummy cell.

3. The non-volatile semiconductor storage device according to claim 2, wherein if a word line adjacent to the dummy word line is the first unselected word line, the control circuit is configured to set a voltage value of the fourth voltage to be substantially the same as a voltage value of the third voltage.

4. The non-volatile semiconductor storage device according to claim 1, wherein the second voltage is lower than the first voltage by a certain voltage value.

5. The non-volatile semiconductor storage device according to claim 1, wherein the control circuit is configured to change a voltage value of the second voltage with a voltage value of the first voltage.

6. The non-volatile semiconductor storage device according to claim 1, wherein the control circuit is configured to change a voltage value of the third voltage with a voltage value of the first voltage.

7. The non-volatile semiconductor storage device according to claim 1, wherein the control circuit is configured to fix respective voltage values of the second voltage and the third voltage with a voltage value of the first voltage.

8. The non-volatile semiconductor storage device according to claim 1, wherein the control circuit is configured to:

apply the first voltage to the selected word line, the second voltage to the first unselected word line, the third voltage to the second unselected word line, and the read pass voltage to the third unselected word line to perform a read operation, when the first voltage is not less than a certain value; and apply the first voltage to the selected word line, and the read pass voltage to the first unselected word line, the second unselected word line, and the third unselected word line to perform a read operation, when the first voltage is less than a certain value.

9. The non-volatile semiconductor storage device according to claim 1, wherein if a word line connected to one of the non-volatile memory cells adjacent to the select transistor is the first unselected word line, the control circuit is configured to apply a fifth voltage at which the non-volatile memory cell adjacent to the select transistor may become conductive, to a select gate line connected to the select transistor, if the word line connected to one of the non-volatile memory cells adjacent to the select transistor is not the first unselected word line, the control circuit is configured to apply a sixth voltage to a select gate line connected to the select transistor, and the fifth voltage is more than the sixth voltage.

10. A non-volatile semiconductor storage device comprising:

a memory cell array including an array of NAND cell units, each of the NAND cell units including a memory string having a plurality of non-volatile memory cells connected in series and select transistors each connected to an end of the memory string;

word lines each connected to a control gate electrode of each of the non-volatile memory cells;

bit lines each connected to a first end of each of the NAND cell units;

a source line connected to a second end of each of the NAND cell units; and a control circuit configured to control a data read operation by selecting one of the non-volatile memory cells as a selected memory cell, the non-volatile memory cells being provided with a plurality of threshold voltage distributions allocated corresponding to multiple pieces of data to be stored, when performing the data read operation, the control circuit being configured to:

apply a first voltage to a selected word line as one of the word lines that is connected to the selected memory cell and to a first unselected word line as one of the word lines adjacent to the selected word line, the first voltage being a voltage between the plurality of threshold voltage distributions;

apply a third voltage to a second unselected word line as one of the word lines adjacent to the first unselected word line, the third voltage being not less than a read pass voltage at which the non-volatile memory cells may become conductive irrespective of the plurality of threshold voltage distributions provided thereto; and apply the read pass voltage to a third unselected word line, the third unselected word line being an unselected word line other than the first unselected word line and the second unselected word line.

11. The non-volatile semiconductor storage device according to claim 10, wherein one of the non-volatile memory cells adjacent to the select transistor in each of the NAND cell units is a dummy cell that is not used for data storage, and when performing the data read operation, the control circuit is configured to apply a fourth voltage at which the dummy cell may become conductive to a dummy word line connected to the dummy cell.

12. The non-volatile semiconductor storage device according to claim 11, wherein if a word line adjacent to the dummy word line is the first unselected word line, the control circuit is configured to set a voltage value of the fourth voltage to be substantially the same as a voltage value of the third voltage.

13. The non-volatile semiconductor storage device according to claim 10, wherein
the control circuit is configured to:
apply the first voltage to the selected word line and the first unselected word line, the third voltage to the second unselected word line, and the read pass voltage to the third unselected word line to perform a read operation, when the first voltage is not less than a certain value; and
apply the first voltage to the selected word line, and the read pass voltage to the first unselected word line, the second unselected word line, and the third unselected word line to perform a read operation, when the first voltage is less than a certain value.

14. The non-volatile semiconductor storage device according to claim 10, wherein
if a word line connected to one of the non-volatile memory cells adjacent to the select transistor is the first unselected word line, the control circuit is configured to apply a fifth voltage at which the non-volatile memory cell adjacent to the select transistor may become conductive, to a select gate line connected to the select transistor,
if the word line connected to one of the non-volatile memory cells adjacent to the select transistor is not the first unselected word line, the control circuit is configured to apply a sixth voltage to a select gate line connected to the select transistor, and
the fifth voltage is more than the sixth voltage.

15. A method of controlling a non-volatile semiconductor storage device, the non-volatile semiconductor storage device comprising:
a non-volatile memory cell being provided with a plurality of threshold voltage distributions allocated corresponding to multiple pieces of data to be stored;
a memory cell array including an array of NAND cell units, each of the NAND cell units including a memory string having a plurality of the non-volatile memory cells connected in series and select transistors each connected to an end of the memory string;
word lines each connected to a control gate electrode of each of the non-volatile memory cells;
bit lines each connected to a first end of each of the NAND cell units;
a source line connected to a second end of each of the NAND cell units; and
a control circuit configured to control a data read operation by selecting one of the non-volatile memory cells as a selected memory cell,
the method comprising:
when performing the data read operation, applying, by the control circuit, a first voltage to a selected word line as one of the word lines that is connected to the selected memory cell, the first voltage being a voltage between the plurality of threshold voltage distributions;
applying, by the control circuit, a second voltage to a first unselected word line as one of the word lines adjacent to the selected word line, the second voltage being not more than the first voltage;
applying, by the control circuit, a third voltage to a second unselected word line as one of the word lines adjacent to the first unselected word line, the third voltage being not less than a read pass voltage at which the non-volatile memory cells may become conductive irrespective of the plurality of threshold voltage distributions provided thereto; and
applying, by the control circuit, the read pass voltage to a third unselected word line, the third unselected word line being an unselected word line other than the first unselected word line and the second unselected word line.

16. The method of controlling the non-volatile semiconductor storage device according to claim 15, wherein
one of the non-volatile memory cells adjacent to the select transistor in each of the NAND cell units is a dummy cell that is not used for data storage, and
when performing the data read operation, the control circuit is configured to apply a fourth voltage at which the dummy cell may become conductive to a dummy word line connected to the dummy cell.

17. The method of controlling the non-volatile semiconductor storage device according to claim 16, wherein
if a word line adjacent to the dummy word line is the first unselected word line, the control circuit is configured to set a voltage value of the fourth voltage to be substantially the same as a voltage value of the third voltage.

18. The method of controlling the non-volatile semiconductor storage device according to claim 15, wherein
the control circuit is configured to change a voltage value of the second voltage with a voltage value of the first voltage.

19. The method of controlling the non-volatile semiconductor storage device according to claim 15, wherein
the control circuit is configured to change a voltage value of the third voltage with a voltage value of the first voltage.

20. The method of controlling the non-volatile semiconductor storage device according to claim 15, wherein
the control circuit is configured to fix respective voltage values of the second voltage and the third voltage with a voltage value of the first voltage.

* * * * *